United States Patent
DeMao et al.

(10) Patent No.: US 9,642,230 B2
(45) Date of Patent: May 2, 2017

(54) SYSTEMS AND METHODS OF PROVIDING ENHANCED ELECTRIC FENCE DIAGNOSTICS

(71) Applicant: Electric Guard Dog, LLC, Columbia, SC (US)

(72) Inventors: Jack DeMao, Charlotte, NC (US); Steve Batti, Banks, OR (US); Michael Baxter, Portland, OR (US); Mark Roberts, Beaverton, OR (US)

(73) Assignee: ELECTRIC GUARD DOG, LLC, Columbia, SC (US)

( * ) Notice: Subject to any disclaimer, the term of this patent is extended or adjusted under 35 U.S.C. 154(b) by 580 days.

(21) Appl. No.: 14/211,348

(22) Filed: Mar. 14, 2014

(65) Prior Publication Data
US 2014/0265626 A1    Sep. 18, 2014

Related U.S. Application Data

(60) Provisional application No. 61/787,425, filed on Mar. 15, 2013.

(51) Int. Cl.
| | |
|---|---|
| *H05C 1/04* | (2006.01) |
| *H05C 1/06* | (2006.01) |
| *G01R 21/133* | (2006.01) |
| *G01R 31/02* | (2006.01) |
| *G01R 31/36* | (2006.01) |

(52) U.S. Cl.
CPC ............. *H05C 1/04* (2013.01); *G01R 21/133* (2013.01); *G01R 31/02* (2013.01); *G01R 31/3606* (2013.01); *H05C 1/06* (2013.01)

(58) Field of Classification Search
CPC .................................... H05C 1/04; H05C 1/06
See application file for complete search history.

(56) References Cited

U.S. PATENT DOCUMENTS

| | | | |
|---|---|---|---|
| 4,037,269 A | 7/1977 | Ferguson |
| 4,114,185 A | 9/1978 | Gallagher |
| 4,200,809 A | 4/1980 | Madsen |
| 4,270,735 A | 6/1981 | Gavin |
| 4,297,633 A | 10/1981 | McCutchan et al. |
| 4,310,869 A | 1/1982 | Niven |
| 4,316,232 A | 2/1982 | Phillips et al. |

(Continued)

FOREIGN PATENT DOCUMENTS

| | | |
|---|---|---|
| AU | 735681 B3 | 7/2001 |
| AU | 2003100627 A4 | 9/2003 |

(Continued)

OTHER PUBLICATIONS

International Search Report and Written Opinion for PCT/US2014/028284, dated Aug. 21, 2014, 8 pages.

(Continued)

*Primary Examiner* — Jeffrey Shin
(74) *Attorney, Agent, or Firm* — Brown & Michaels, PC

(57) ABSTRACT

An electric fence energizer provides automated reporting of faults and other events as well as fault location to reduce effort in diagnosing faults and intrusion events in electric fences by measuring impedance changes using a time-domain reflectometer. In some embodiments, methods determine the location of a fault in distance from the energizer and provide timely and appropriate condition information.

8 Claims, 4 Drawing Sheets

(56) References Cited

U.S. PATENT DOCUMENTS

| | | |
|---|---|---|
| 4,394,583 A | 7/1983 | Standing |
| 4,396,879 A | 8/1983 | Weinreich et al. |
| 4,691,084 A | 9/1987 | Standing |
| 4,859,868 A | 8/1989 | McKissack |
| 4,939,618 A | 7/1990 | Fingerson et al. |
| 5,285,195 A | 2/1994 | Way et al. |
| 5,381,298 A | 1/1995 | Shaw et al. |
| 5,460,123 A | 10/1995 | Kolz |
| 5,514,919 A | 5/1996 | Walley |
| 5,550,530 A | 8/1996 | Hamm |
| 5,596,281 A | 1/1997 | Eriksson |
| 5,742,104 A | 4/1998 | Eriksson et al. |
| 5,742,469 A | 4/1998 | Hamm |
| 5,767,592 A | 6/1998 | Boys et al. |
| 5,771,147 A | 6/1998 | Eriksson et al. |
| 5,790,023 A | 8/1998 | Wolfgram et al. |
| 5,877,949 A | 3/1999 | Wolfgram et al. |
| 5,973,413 A | 10/1999 | Walley |
| D419,957 S | 2/2000 | Burdick |
| 6,020,658 A | 2/2000 | Woodhead et al. |
| 6,065,427 A | 5/2000 | Peinetti |
| 6,116,192 A | 9/2000 | Hultine et al. |
| 6,398,191 B1 | 6/2002 | Forsberg |
| 6,479,909 B1 | 11/2002 | Hamm et al. |
| 6,690,565 B2 | 2/2004 | Montreuil |
| 6,801,045 B2 | 10/2004 | Hamm et al. |
| 7,148,779 B2 | 12/2006 | Wolfgram |
| 7,268,562 B2 | 9/2007 | Aisenbrey |
| 7,582,988 B2 | 9/2009 | Wolfgram |
| 7,835,131 B2 | 11/2010 | Hurly |
| 7,893,521 B2 | 2/2011 | Lunenburg et al. |
| 7,944,669 B2 | 5/2011 | Wolfgram |
| 8,120,212 B2 | 2/2012 | Hamm et al. |
| 8,120,213 B2 | 2/2012 | Hurly |
| 8,415,962 B2 | 4/2013 | Shan et al. |
| 2002/0079909 A1 | 6/2002 | Reeves |
| 2004/0169171 A1 | 9/2004 | Reeves et al. |
| 2006/0126260 A1 | 6/2006 | Fehse |
| 2008/0186172 A1 | 8/2008 | Thompson |
| 2009/0109026 A1 | 4/2009 | Thompson |
| 2010/0139576 A1* | 6/2010 | Kim ............... A01K 15/023 119/721 |
| 2011/0211292 A1 | 9/2011 | Tyler |
| 2012/0133378 A1 | 5/2012 | Shan et al. |

FOREIGN PATENT DOCUMENTS

| | | |
|---|---|---|
| AU | 2003252846 A1 | 4/2004 |
| AU | 2004201668 A1 | 12/2004 |
| AU | 2005100855 A4 | 12/2005 |
| AU | 2005100856 A4 | 12/2005 |
| AU | 2010100764 A4 | 9/2010 |
| AU | 2011204810 A1 | 2/2012 |
| AU | 2012202699 A1 | 11/2012 |
| FR | 2673020 A1 | 8/1992 |
| JP | 2006163659 A | 6/2006 |
| KR | 20120068065 A | 6/2012 |
| NZ | 240641 A | 7/1995 |
| NZ | 530924 A | 6/2005 |
| WO | 9617440 A1 | 6/1996 |
| WO | 0035253 A1 | 6/2000 |
| WO | 2004095893 A1 | 11/2004 |
| WO | 2008083434 A1 | 7/2008 |
| WO | 2010062200 A1 | 6/2010 |

OTHER PUBLICATIONS

Extended European International Search Report from PCT/US2014/0428284 dated Jan. 20, 2016.

* cited by examiner

SYSTEMS AND METHODS OF PROVIDING ENHANCED ELECTRIC FENCE DIAGNOSTICS

REFERENCE TO RELATED APPLICATIONS

This application claims one or more inventions which were disclosed in Provisional Application No. 61/787,425, filed Mar. 15, 2013, entitled "SYSTEMS AND METHODS OF PROVIDING ENHANCED ELECTRIC FENCE DIAGNOSTICS". The benefit under 35 USC §119(e) of the United States provisional application is hereby claimed, and the aforementioned application is hereby incorporated herein by reference.

BACKGROUND OF THE INVENTION

Field of the Invention

The invention pertains to the field of electrical fences. More particularly, the invention pertains to systems and methods of enhanced electrical fence diagnostics.

Description of Related Art

Electric fence energizers provide an electrical pulse down a fence wire that is intended to deter intruders. This pulse is designed to be non-lethal but of sufficient magnitude to be an effective deterrent. Unfortunately, current conventional energizers have several drawbacks. These drawbacks include that they provide no guidance to locate a fault in the fence on a very large premise, they provide very little feedback, if any, about the condition of a fence or energizer prior to a catastrophic failure, and they provide a limited selection of power output levels.

SUMMARY OF THE INVENTION

An electric fence energizer provides automated reporting of faults and other events as well as fault location to reduce effort in diagnosing faults and intrusion events in electric fences by measuring impedance changes using a time-domain reflectometer. In some embodiments, methods determine the location of a fault in distance from the energizer and provide timely and appropriate condition information.

DETAILED DESCRIPTION OF THE INVENTION

Embodiments of the present invention preferably address shortcomings of the prior art by providing an estimate of the location of a fault in distance from the energizer and providing timely and appropriate condition information via analytical methods. This analytic information may be relayed via a cell phone link or a fixed connection to an operator, which is in turn used to determine the condition of the fence and energizer. Finally, in some embodiments, a method provides a continuously-variable power output to augment a location estimation system and also provides the appropriate power for a fence of any length and power requirements. This continuously-variable output has many intrinsic benefits aside from assisting with the diagnosis of faults and conditions.

Figure 1:
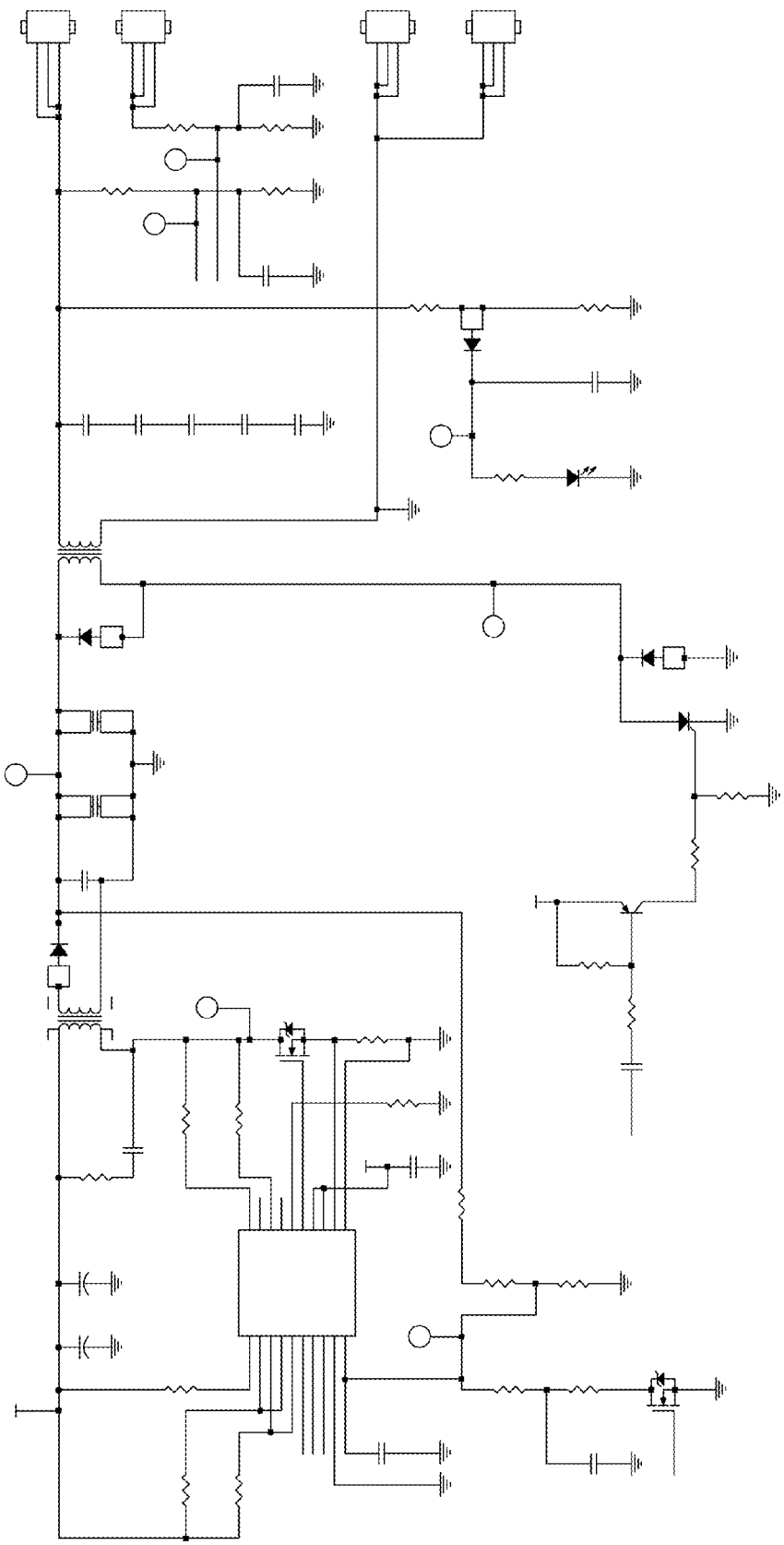
FIG. 1 shows a circuit diagram of an electric fence in an embodiment of the present invention.
Figure 2:
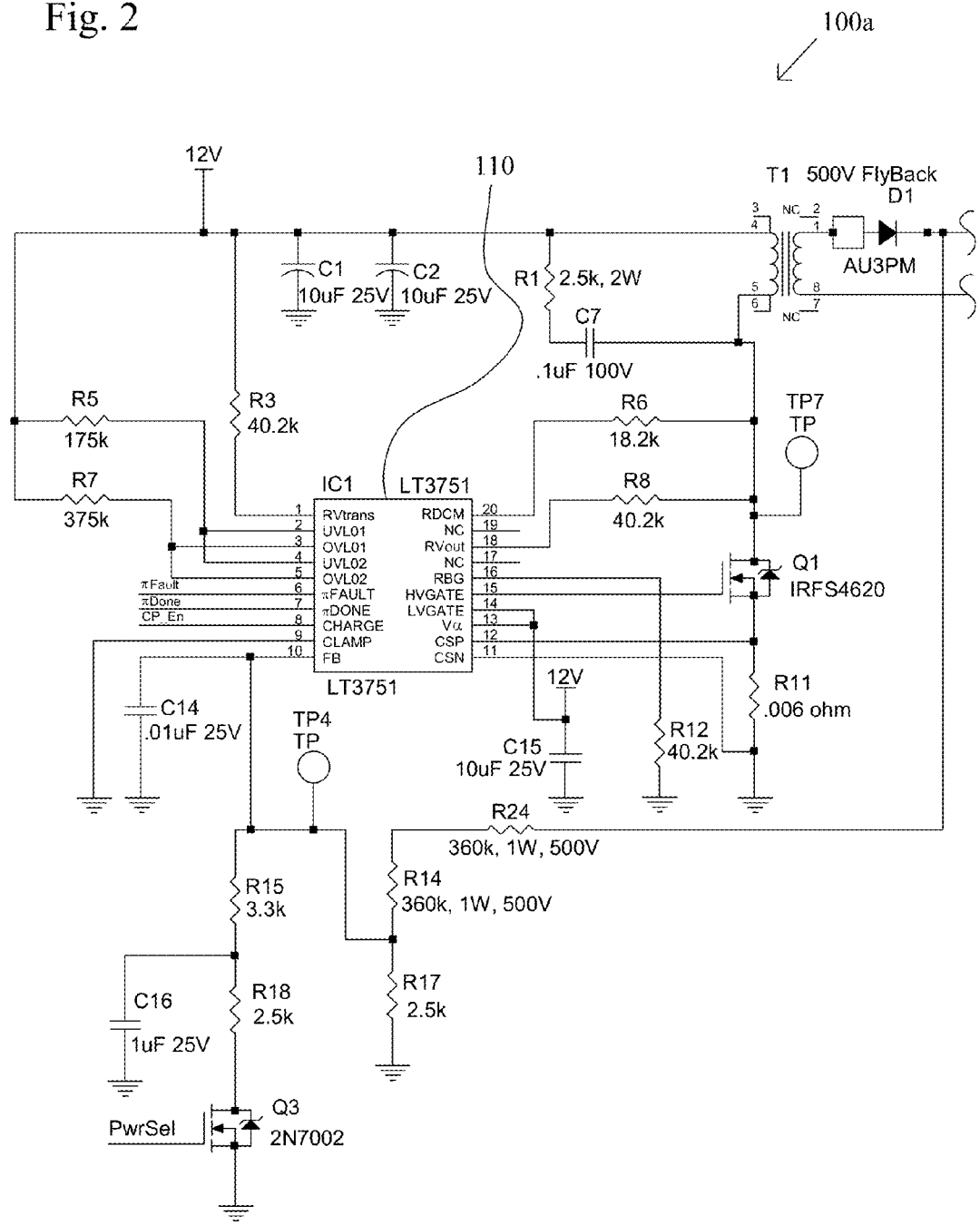
FIG. 2 shows the left portion of the circuit diagram of FIG. 1.
Figure 3:
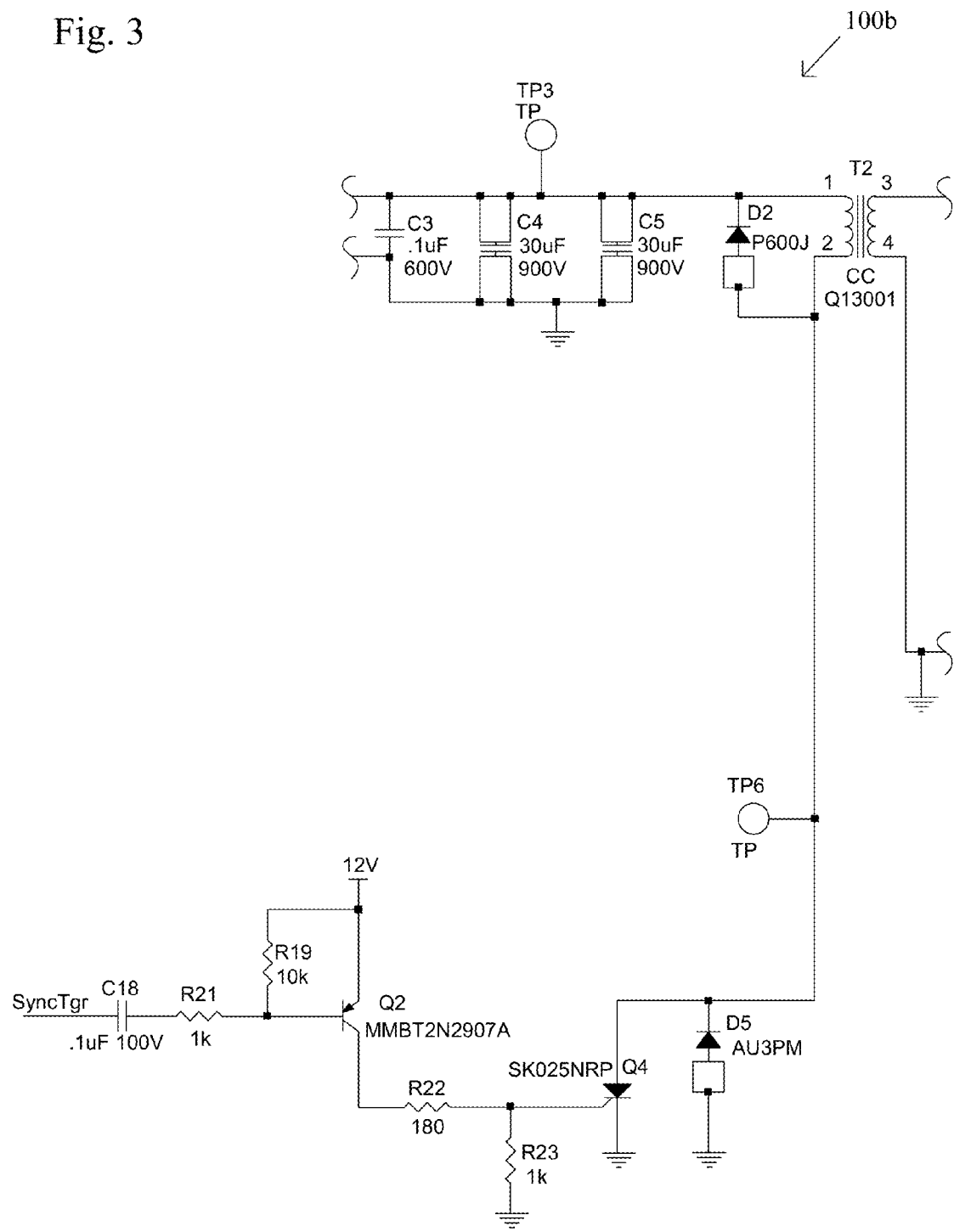
FIG. 3 shows the center portion of the circuit diagram of FIG. 1.
Figure 4:
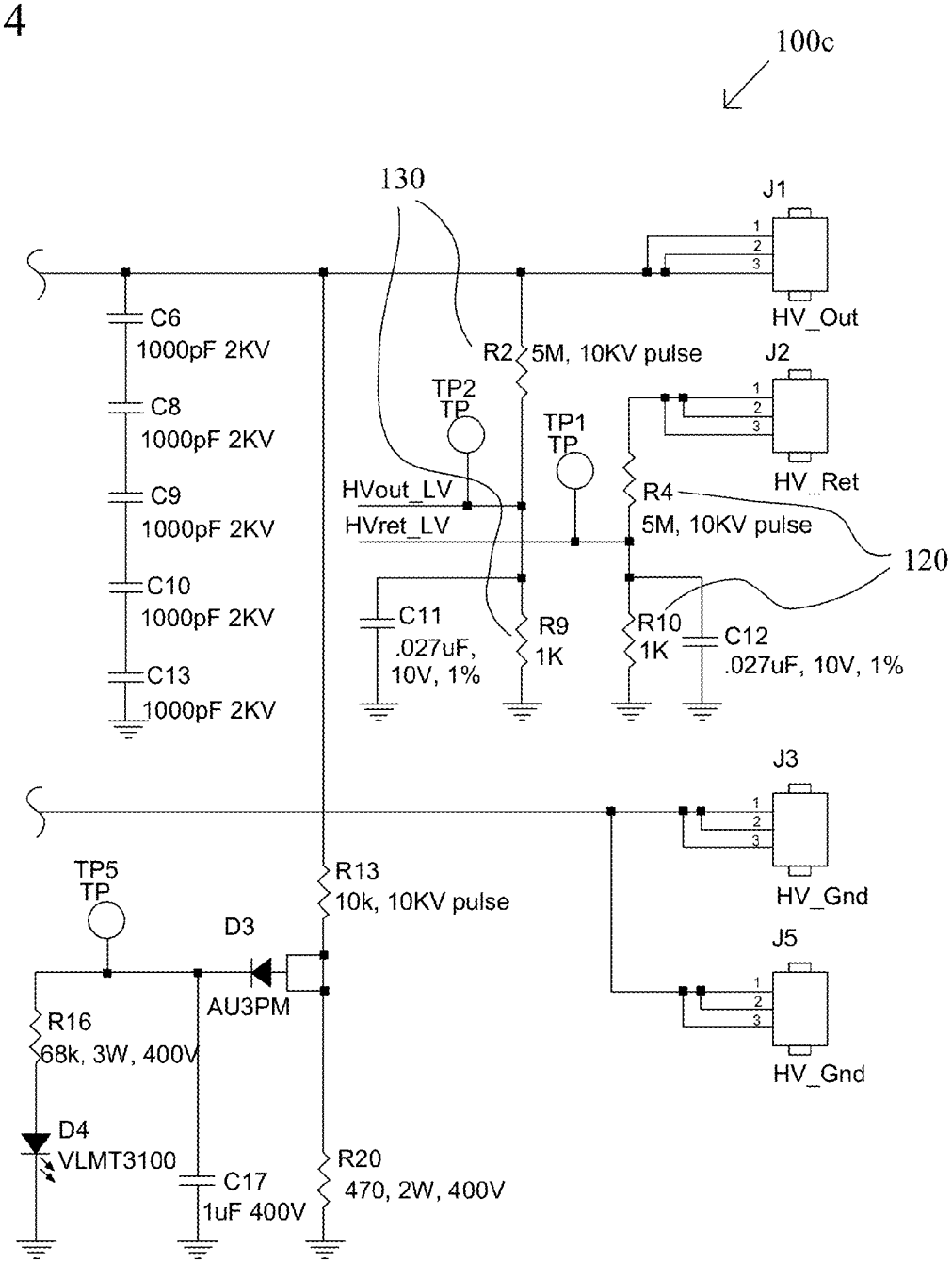
FIG. 4 shows the right portion of the circuit diagram of FIG. 1.

FIG. 1 shows a circuit diagram (100) that implements the continuously-variable power output and measurements needed for the analytic condition information in a preferred embodiment of the present invention. Closer views of the left portion (100a) the central portion (100b) and the right portion (100c) of the circuit diagram are shown in FIG. 2 through FIG. 4. The circuit concept for the variable power is to vary the intermediate voltage of the pulse capacitors. The cap voltage is varied by biasing the feedback resistor network of the high voltage capacitor charger controller with regulation to provide any value desired. In a preferred embodiment, the high voltage capacitor charger controller with regulation (110) is of the type LT3751 (Linear Technology Corp., Milpitas, Calif., USA). This biasing is achieved by low-pass filtering a pulse-width-modulated (PWM) output from a micro-processor to set the effective voltage divider value for the feedback network. The circuit concept for the analytic measurements is to divide the output and return voltages, via resistor dividers r4 r10 (120) and r2 r9 (130), down to safe levels that can be directly sampled by a micro-processor. The fence is connected in a loop, where the output goes on one end of the loop and the return is the other end of the loop.

Fault location estimation is preferably based on an adaptation of time-domain reflectometry. The micro-processor rapidly samples the voltage of the outgoing and returning pulses. This allows the processor to perform various analyses on these sampled wave forms to look for faults, intrusions, or other aspects or irregularities of interest.

In some embodiments, the fence energizer is coordinated with other units to provide synchronized firing of energizers among coupled fences. This feature, while not necessary for analytic purposes, greatly increases the usefulness of the fence energizer in areas where multiple electric fences must be placed in close proximity. In some embodiments, an inductive coupling ring, such as, for example, those found in clamp-on current-measuring probes, detects the outgoing pulse from an energizer deemed to be the master. The adjacent units are set into a slave mode, where they trigger off of the signal sent by the coupling ring. A benefit of this arrangement is its simplicity, where a ring is simply clipped around the wire of the master fence and the mode of the others is sent.

Systems and methods of the present invention are preferably used with an electric fence energizer of an electric fence system. Example locations for an electric fence energizer that would benefit from systems and methods of the present invention include, but are not limited to, equipment storage lots, perimeter fences around high-security buildings, inventory warehouses, and any locations that need a protective fence.

Preferred advantages provided by systems and methods of the present invention include, but are not limited to, the following:

- a greatly expedited diagnostic process in finding fault locations of a fence,
- the ability to see trends in energizer performance that indicate action is needed before a catastrophic failure happens, which increases the ability of an operator to schedule maintenance rather than responding to a fence failure,
- remote reporting of data capabilities to correlate weather patterns, water dew patterns, and other public data to determine the state of vegetation touching the fence wire, information that may be used to determine when landscape maintenance or other work must be performed to keep the fence in top shape, estimating the condition of the fence to indicate tampering, fence joints that have become loose, or other problems with the fence wire by measuring the outgoing and returning voltages of the fence pulse, the ability to implement new analytic methods that are used to determine the performance or the condition of various pieces of the fence system, reducing the amount of time a person must be on-site working on an electric fence, providing an appropriate power output level for any given fence, thereby increasing safety and reducing power waste, and permitting easy coupling of two or more electric fences to synchronize the energizers to pulse at the same time or nearly the same time.

Systems and methods of the present invention may be used in new electric fence energizer systems or to enhance existing electric fence energizer performance, where they may be incorporated directly into existing products or provided by way of an add-on assembly.

In preferred embodiments, a time-domain reflectometer (TDR) is used to determine reflections of the electric pulse sent on the fence. A TDR is an electronic instrument conventionally used to characterize and locate faults in metallic cables, such as, for example, twisted wire pairs and coaxial cables. The TDR transmits a short rise time pulse along a conduction route of the electric fence. Any impedance discontinuities in the route cause some of the incident signal to be sent back, or reflected, towards the source. Increases in the impedance create a reflection that reinforces the original pulse, but decreases in the impedance create a reflection that opposes the original pulse. Return signals for given impulses are preferably compared to baseline return signals previously measured for a particular electric fence. A change in the measured return signal indicates a change in the electrical properties of the electric fence, which may be indicative of a problem with the electric fence. In the present application of a TDR, both the reflected and the transmitted signals are preferably collected and quantified.

In some embodiments, the electric fence energizer uses quantitative methods to compare signals and to determine from the reflection pattern the location of faults in the electric fence.

In some embodiments, the electric fence energizer maps a given fence by learning the standard reflection pattern of the fence to be used as a comparison standard to identify anomalous future events, intrusions, and faults.

In some embodiments, the electric fence energizer incorporates variable power level output to augment TDR function.

In some embodiments, the electric fence energizer provides variable power level output via a software-settable value for use with different sized fences.

In some embodiments, the electric fence energizer provides variable power level output settable via cell-phone link for use with different sized fences.

In some embodiments, the electric fence energizer incorporates analytic methods to provide real-time diagnostic information about the condition of the electric fence, including, but not limited to, if vegetation has grown up onto the fence, if a person has tampered with the fence, or other anomalous conditions.

In some embodiments, the electric fence energizer uses the electrical properties of the output pulses to determine the overall length of a fence. If the electrical properties of the output pulses change over time, as would occur if the fence length changed, this indicates tampering with the fence or other problems.

In some embodiments, the electric fence energizer incorporates analytic methods to provide real-time diagnostic information about the condition of the energizer unit or its power supply.

In some embodiments, the electric fence energizer incorporates multiple gradations in the alarm criteria, including, but not limited to, an indication of how close the fence or energizer unit is to catastrophic failure.

In some embodiments, the electric fence energizer is capable of receiving new software to implement new analytic methods as desired to determine performance or condition of various pieces of the fence system.

In some embodiments, the electric fence energizer receives sensor input from an inductively-coupled (sometimes called a transformer-coupled) sensor.

In some embodiments, the electric fence energizer coordinates its pulse firing with the input from another energizer generated by this inductive coupling.

In some embodiments, the electric fence energizer coordinates its pulse firing with input from another energizer generated by direct measurement of an electrical pulse.

The TDR capabilities in an electric fence energizer are preferably used to estimate a fault location. The electric fence energizer preferably provides continuously variable power output settings via a software-settable value. The electric fence energizer preferably provides analytic information that may be used to determine the condition of the fence, the energizer unit, or its power supply.

Methods of the present invention are preferably computer-implemented. The methods presented herein are not inherently related to any particular computer or other apparatus. Various general purpose systems may also be used with programs in accordance with the teachings herein, or it may prove convenient to construct more specialized apparatus to perform the required method steps. In addition, the present invention is not described with reference to any particular programming language. It is appreciated that a variety of programming languages may be used to implement the teachings of the present invention as described herein, and any references to specific languages are provided for disclosure of enablement and best mode of the present invention.

The present invention is well suited to a wide variety of computer network systems over numerous topologies. Within this field, the configuration and management of large networks include storage devices and computers that are communicatively coupled to dissimilar computers and storage devices over a network, such as the internet. A computer, as used herein, may be any automated processor that operates based on following instruction codes. In some embodiments, a computer refers to a network of two or more processors working together to follow such instruction codes.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of diagnosing and controlling an electric fence system comprising an electric fence, an energizer having an output with an adjustable power level, and a microprocessor coupled to the energizer and to the electric fence, the method comprising the steps of:
   a) the microprocessor determining a power requirement for operation of the electric fence of the electric fence system by the steps of:
      i) the microprocessor of the electric fence system sampling voltages of outgoing pulses from the energizer and voltages of returning pulses from the electric fence;
      ii) the microprocessor analyzing the outgoing pulses and the returning pulses in real time to determine a condition of the first energizer and a condition of the electric fence; and
   b) the microprocessor setting the power level of the output of the energizer of the electric fence system to match the power requirement.

2. The method of claim 1, wherein step b) comprises adjusting an intermediate voltage of at least one pulse capacitor of the first energizer.

3. The method of claim 1, wherein step b) comprises biasing a feedback resistor network of a high voltage capacitor charger controller with regulation of the first energizer.

4. The method of claim 3, wherein biasing the feedback resistor network is achieved by low-pass filtering a pulse-width-modulated output from a microprocessor of the electric fence system to set a voltage divider value for the feedback resistor network.

5. The method of claim 1, wherein step b) comprises the sub-step of setting the power level output by an input from a cell phone link.

6. An energizer for an electric fence, the energizer comprising:
   a) at least one pulse capacitor having an adjustable voltage output;
   b) a microprocessor coupled to the adjustable voltage output of the at least one pulse capacitor and to the electric fence; the microprocessor being programmed to execute a method of adjusting the adjustable voltage output of the at least one pulse capacitor, comprising the steps of:
      i) the microprocessor sampling voltages of outgoing pulses from the adjustable voltage output of the at least one pulse capacitor and voltages of returning pulses from the electric fence;
      ii) the microprocessor analyzing the outgoing pulses and the returning pulses in real time to determine a condition of the energizer and a condition of the electric fence; and
      iii) the microprocessor adjusting the adjustable voltage output of the at least one pulse capacitor to match the power requirement.

7. The energizer of claim 6 further comprising at least one voltage divider dividing an output voltage of the energizer to the electric fence for direct sampling by the microprocessor.

8. The energizer of claim 6 further comprising a cell phone link coupled to the microprocessor, and the microprocessor is further programmed to execute the step of adjusting the adjustable voltage output of the at least one pulse capacitor based on an input from the cell phone link.

* * * * *